(12) United States Patent
Shinohara

(10) Patent No.: US 6,460,111 B1
(45) Date of Patent: Oct. 1, 2002

(54) SEMICONDUCTOR DISK DRIVE AND METHOD OF CREATING AN ADDRESS CONVERSION TABLE BASED ON ADDRESS INFORMATION ABOUT DEFECTIVE SECTORS STORED IN AT LEAST ONE SECTOR INDICATED BY A MANAGEMENT CODE

(75) Inventor: Takayuki Shinohara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/124,964

(22) Filed: Jul. 30, 1998

(30) Foreign Application Priority Data

Mar. 9, 1998 (JP) .......................................... 10-056633

(51) Int. Cl.⁷ .............................................. G06F 12/00
(52) U.S. Cl. ......................... 711/103; 711/4; 711/205; 711/206
(58) Field of Search .................... 711/103, 205, 711/206, 4; 360/49; 365/200; 369/54, 58

(56) References Cited

U.S. PATENT DOCUMENTS

| | | | | |
|---|---|---|---|---|
| 4,376,300 A | * | 3/1983 | Tsang ......................... 365/200 |
| 4,667,330 A | * | 5/1987 | Kumagai ..................... 714/824 |
| 5,075,804 A | * | 12/1991 | Deyring ....................... 360/49 |
| 5,146,571 A | * | 9/1992 | Logan ............................ 714/8 |
| 5,319,627 A | * | 6/1994 | Shinno et al. ................. 369/54 |
| 5,418,752 A | | 5/1995 | Harari et al. |
| 5,526,335 A | * | 6/1996 | Tamegai ....................... 369/58 |
| 5,541,903 A | * | 7/1996 | Funahashi et al. ............. 369/54 |
| 5,742,934 A | * | 4/1998 | Shinohara ................... 711/103 |
| 5,822,256 A | * | 10/1998 | Bauer et al. ................. 365/200 |
| 5,905,993 A | * | 5/1999 | Shinohara ................... 711/103 |
| 5,946,714 A | * | 8/1999 | Miyauchi .................... 711/205 |
| 5,983,309 A | * | 11/1999 | Atsatt et al. .................... 711/4 |
| 6,125,424 A | * | 9/2000 | Komatsu et al. ............ 711/103 |

FOREIGN PATENT DOCUMENTS

JP             63-059618          3/1988

* cited by examiner

*Primary Examiner*—Zarni Maung
*Assistant Examiner*—Nabil El-Hady
(74) *Attorney, Agent, or Firm*—McDermott, Will & Emery

(57) ABSTRACT

A semiconductor disk drive using a non-volatile memory of MGM such as flash memory, allowing swift access of nondefective sectors or blocks, and shortening the time for creating a logical/physical conversion table, and a method of creating the logical/physical address conversion table for the semiconductor disk drive. According to the disk drive and the method, the addresses of all defective sectors are stored in predetermined sectors or in a predetermined block during manufacturing process, and a CPU for internal control creates a logical/physical address conversion table in a memory for CPU, based on the sector addresses of all defective sectors.

11 Claims, 5 Drawing Sheets

Fig.2

| Block address | Sector address | Sector state | Management area |
|---|---|---|---|
| Block 2047 | Sector 16383 | Address storage sector (1) for defective sectors | XYZ |
| | Sector 16382 | Address storage sector (2) for defective sectors | XYZ |
| | Sector 16381 | Address storage sector (3) for defective sectors | XYZ |
| | Sector 16380 | Address storage sector (4) for defective sectors | XYZ |
| | Sector 16379 | Address storage sector (5) for defective sectors | XYZ |
| | Sector 16378 | Address storage sector (6) for defective sectors | XYZ |
| | Sector 16377 | Address storage sector (7) for defective sectors | XYZ |
| | Sector 16376 | Address storage sector (8) for defective sectors | XYZ |
| | Sector 16375 | Defective sector | — |
| ----- | ----- | ----- | ----- |
| Block 0 | Sector 8 | Nondefective sector | ABC |
| | Sector 7 | Defective sector | — |
| | Sector 6 | Defective sector | — |
| | Sector 5 | Defective sector | — |
| | Sector 4 | Nondefective sector | ABC |
| | Sector 3 | Nondefective sector | ABC |
| | Sector 2 | Nondefective sector | ABC |
| | Sector 1 | Defective sector | — |
| | Sector 0 | Nondefective sector | ABC |

| Block address | Sector address | Sector state | Management area |
|---|---|---|---|
| Block 2047 | Sector 16383 | Nondefective sector | ABC |
| | Sector 16382 | Nondefective sector | ABC |
| | Sector 16381 | Nondefective sector | ABC |
| | Sector 16380 | Nondefective sector | ABC |
| | Sector 16379 | Nondefective sector | ABC |
| | Sector 16378 | Nondefective sector | ABC |
| | Sector 16377 | Nondefective sector | ABC |
| | Sector 16376 | Nondefective sector | ABC |
| | Sector 16375 | Defective sector | — |
| ----- | ----- | ----- | ----- |
| Block 0 | Sector 8 | Nondefective sector | ABC |
| | Sector 7 | Defective sector | — |
| | Sector 6 | Defective sector | — |
| | Sector 5 | Defective sector | — |
| | Sector 4 | Nondefective sector | ABC |
| | Sector 3 | Nondefective sector | ABC |
| | Sector 2 | Nondefective sector | ABC |
| | Sector 1 | Defective sector | — |
| | Sector 0 | Nondefective sector | ABC |

SEMICONDUCTOR DISK DRIVE AND METHOD OF CREATING AN ADDRESS CONVERSION TABLE BASED ON ADDRESS INFORMATION ABOUT DEFECTIVE SECTORS STORED IN AT LEAST ONE SECTOR INDICATED BY A MANAGEMENT CODE

BACKGROUND OF THE INVENTION

1. Field of the Invention

The present invention relates to a semiconductor disk drive that is connected to a host apparatus consisting of information processing devices and is used as a memory medium that uses a non-volatile memory that allows early-stage defects of flash memory and the like at a predetermined ratio. The present invention also relates to a method of creating a logical/physical address conversion table in the semiconductor disk drive.

2. Description of the Related Art

At present, flash memory is known to the public as a non-volatile memory that allows electric erasing and writing. The erasing operation in flash memory is usually performed by a batch erasing method for a plurality of memory cells. However, flash memory that allows erasing and writing in units of sectors has been developed as a product of recent years. Then a process of applying the new product to a semiconductor disk drive having the same interface as in the magnetic disk drive is currently in progress. A control circuit that allows the management of defects of the medium is installed in such a disk drive. A memory device called MGM (Mostly Good Memory) that allows early-stage defects at some ratio is developed as a product for the purpose of increasing the manufacturing yield of highly integrated flash memory.

In such a flash memory having early-stage defects, a nondefectiveness code is written before shipping, in units of sectors or blocks, which are the units of erasing, to indicate whether a sector or block is defective or nondefective. For example, in 64 Mb flash memory of the AND type that allows erasing and writing in units of sectors, each sector consists of 528 B composed of a data area of 512 B and a management area of 16 B.

FIG. 6 illustrates the states of sectors in prior 64 Mb flash memory of the AND type and the nondefectiveness code written in their management areas. Referring to FIG. 6, if one sector consists of 528 B, then a 64 Mb flash memory consists of 16384 sectors or 2048 blocks with one block consisting of 8 sectors. In this construction, a 6 B nondefectiveness code, for example "ABC" in FIG. 6, is written only in the management area of each nondefective sector.

The reading and writing of data from and into the two areas, the data area and the management area, may be respectively performed independently of each other. However, the erasing of data can be performed only in units of sectors or blocks. The reading of data is performed in units of sectors, so that an initial access time of several microseconds is required for reaching the head of the data. However, after the initial access time, the data can be sequentially read out at a clock cycle of tens of nanoseconds for each sector.

However, in previously-known flash memory of such a construction, the nondefectiveness code must be confirmed each time a sector is accessed. Further, when data is erased, the nondefectiveness code is also erased, so that the operation of sheltering the nondefectiveness code before erasing and the operation of rewriting the nondefectiveness code after erasing are necessary. Such operations of confirming and preserving the nondefectiveness code cause the reduction in the performance of a disk drive that uses such a memory.

Therefore, there has been provided a logical/physical address conversion table that converts each logical sector address assigned by the host apparatus to a physical sector address of a nondefective sector. The host apparatus can access a usable nondefective sector at high speed by referring to the conversion table. In an example of creating such a logical/physical address conversion table, the physical address in flash memory corresponding to the logical address 0 is determined as follows.

First, the management area of the sector at physical address 0 is examined to test whether the sector at physical address 0 is usable or not. If it is usable, then the physical address 0 is determined to be the one corresponding to the logical address 0 and is written in the logical/physical address table. If the sector of physical address 0 is unusable, then whether the sector of physical address 1 is usable or not is tested. In this way, the physical addresses corresponding to all the logical addresses of the flash memory are obtained and successively stored in the table.

However, when a logical/physical address conversion table is created according to this method, the nondefectiveness code should be read out for all the logical addresses of flash memory. Therefore, it requires a substantial amount of time to create the logical/physical conversion table in a semiconductor disk drive of large capacity.

In Japanese Patent Laid-Open Publication No. 63-59618, there is disclosed a semiconductor RAM in which a sector management table is installed to record 0 and 1 depending on whether each sector is defective or not. In Japanese Patent Laid-Open Publication No. 9-212411, there is disclosed a flash memory card in which a volatile memory is installed to store address information about usable blocks. They store the address information and defective-sector information in volatile memory.

SUMMARY OF THE INVENTION

In order to solve the above problem, the object of the present invention is to obtain a semiconductor disk drive and a method of creating a physical/logical conversion table that use a non-volatile memory of MGM such as flash memory and the like, that access a nondefective sector or block at high speed, and that shorten the time for creating the logical/physical address conversion table.

A semiconductor disk drive in accordance with the present invention uses MGM, which allows early-stage defects at a predetermined ratio, and is used with a host apparatus consisting of information processing devices. The semiconductor disk drive comprises an interface section that interfaces with the host apparatus, a memory section that is composed of a volatile memory of MGM for which writing and erasing are electrically performed, and a control section that transfers data between the host apparatus and the disk drive through the interface section, converts logical sector addresses to physical sector addresses of the memory section, and performs memory management. The memory section has at least one sector in which address information about defective sectors is stored. The control section creates a logical/physical address conversion table based on the address information about defective sectors stored in the memory section.

According to the above construction, when a logical/physical address conversion table is created, the number of times the volatile memory in the memory section is accessed to obtain the addresses of defective sectors can be reduced. Therefore, the logical/physical address conversion table can be created at high speed.

Further, in the memory section, a management code may be written in a predetermined area of each sector in which address information about defective sectors is stored. The management code indicates that address information about defective sectors is stored in that sector. Then the control section reads out address information about defective sectors from the sectors in which the management code is written. In this case, when creating a logical/physical address conversion table, the control section finds out the sectors in which address information about defective sectors is stored, by checking the management code. In this way, the number of times the volatile memory in the memory section is accessed to obtain the addresses of defective sectors can be reduced. Therefore, the logical/physical address conversion table can be created at high speed.

Further, in the memory section, address information about defective sectors may be stored in the first or last block. In this case, the control section knows the block in which address information about defective sectors is stored. In this way, the number of times the volatile memory in the memory section is accessed to obtain the addresses of defective sectors can be further reduced. Therefore, the logical/physical address conversion table can be created at high speed.

As an alternative method, in the memory section, address information about defective sectors may be stored in the first usable block or the last usable block. In this case, the control section knows the block in which address information about defective sectors is stored. In this way, the number of times the volatile memory in the memory section is accessed to obtain the addresses of defective sectors can be reduced. Therefore, the logical/physical address conversion table can be created at high speed. Moreover, even if the first or last block in the memory section contains an unusable sector, the disk drive can be used, so that the yield of the memory devices can be increased.

Further, in the memory section, address information about defective sectors may be successively stored in sectors from the first address forward or from the last address backward. In this case, the control section knows the sectors in which address information about defective sectors is stored. In this way, the number of times the volatile memory in the memory section is accessed to obtain the addresses of defective sectors can be reduced. Therefore, the logical/physical address conversion table can be created at high speed.

Further, address information about defective sectors may be successively stored in usable sectors from the first usable sector forward or from the last usable sector backward. In this case, the control section knows the sectors in which address information about defective sectors is stored. In this way, the number of times the volatile memory in the memory section is accessed to obtain the addresses of defective sectors can be reduced. Therefore, the logical/physical address conversion table can be created at high speed. Moreover, even if the first or last sector in the memory section is an unusable sector, the disk drive can be used, so that the yield of the memory devices can be increased.

The method of creating the logical/physical address conversion table in accordance with the present invention is a method of creating a logical/physical address conversion table in a memory section of a semiconductor disk drive that uses a memory device MGM, which allows first-stage defects at a predetermined ratio. The present method writes address information indicating the addresses of defective sectors and a management code indicating a sector in which the address information is stored, in at least one predetermined sector of the memory section. Then the method reads out the address information about defective sectors from the sectors in which the management code is written and creates a logical/physical address conversion table, based on the address information about defective sectors.

According to this method, when the logical/physical address conversion table is created, the sectors in which address information about defective sectors are known. In this way, the number of times the volatile memory in the memory section is accessed to obtain the addresses of defective sectors can be reduced. Therefore, the logical/physical address conversion table can be created at high speed.

In implementing this method, the predetermined sectors may be sectors in a first block or the last block. In this case, when the logical/physical conversion table is created, the block in which address information about defective sectors is written is known. In this way, the number of times the volatile memory in the memory section is accessed to obtain the addresses of defective sectors can be reduced. Therefore, the logical/physical address conversion table can be created at high speed.

BRIEF DESCRIPTION OF THE DRAWINGS

These and other objects and features of the present invention will become clear from the following description taken in conjunction with the preferred embodiment thereof and the accompanying drawings throughout which like parts are designated by like reference numerals, and in which:

FIG. 2 illustrates the state of each sector in the memory section and the nondefectiveness code written in the management area.

FIG. 6 illustrates the state of each sector in prior flash memory and the nondefectiveness code written in the management area.

DETAILED DESCRIPTION OF THE PREFERRED EMBODIMENT

Figure 1:
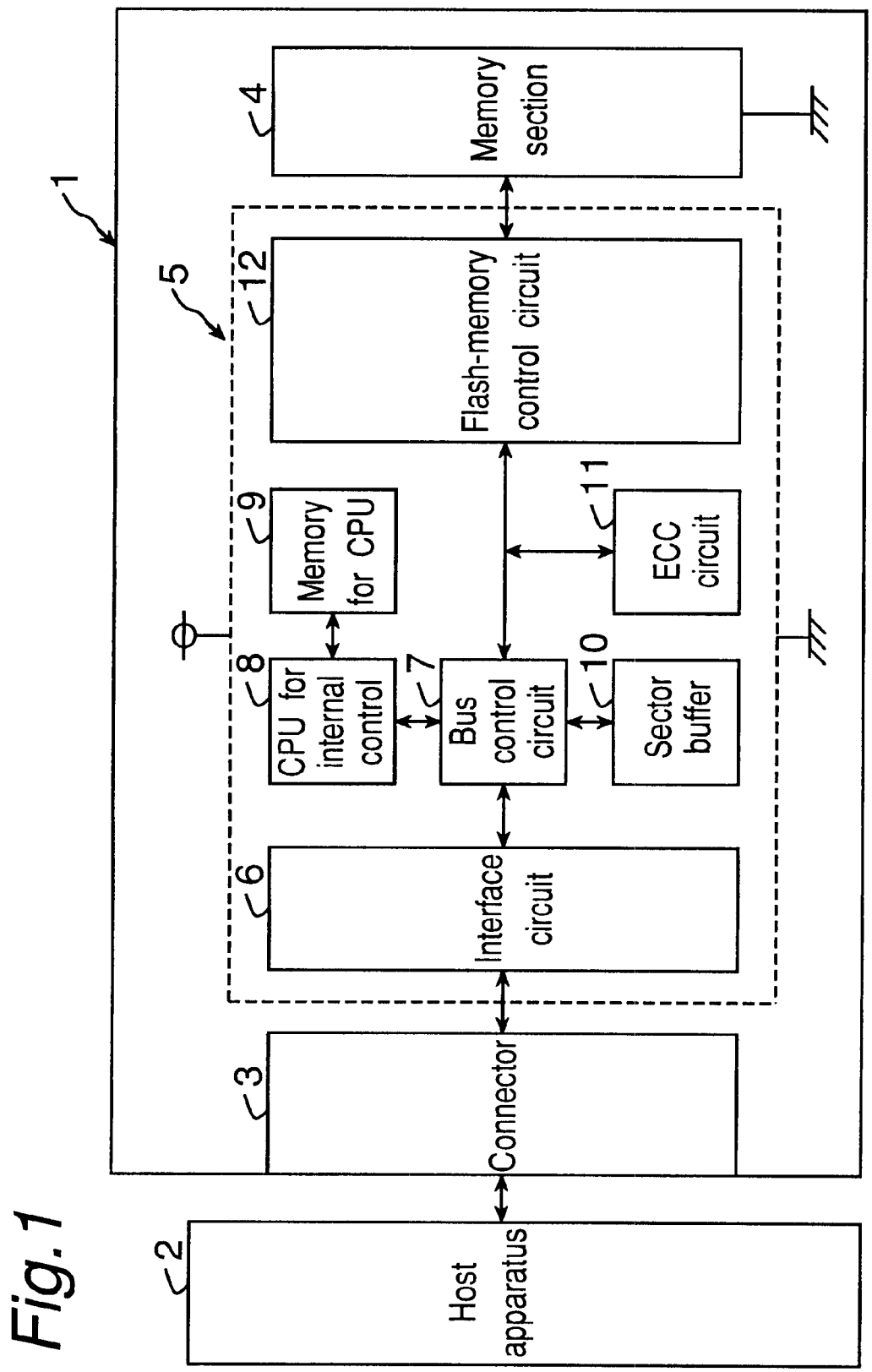
FIG. 1 is a block diagram illustrating a semiconductor disk drive of the preferred embodiment of the present invention.

The preferred embodiment according to the present invention will be described below in conjunction with the attached drawings. FIG. 1 is a block diagram illustrating a semiconductor disk drive of the embodiment in the present invention. In FIG. 1, the disk drive is a PC card that uses 64 Mb flash memory of the AND type and complies with the ATA (AT attachment) standards.

As shown in FIG. 1, a PC card 1 comprises a connector 3 that makes connections to a host apparatus 2 consisting of information processing devices, a memory section 4 that is composed of at least one IC memory formed of flash memory of the AND type, and an ATA card controller 5 that controls memory section 4, converts logical addresses to physical addresses, and controls partial defectiveness of memory section 4. Memory section 4 uses a memory device MGM (Mostly good memory) that allows early-stage defects.

ATA card controller 5 comprises an interface circuit 6, a bus control circuit 6, a CPU 8 for internal control, a memory 9 for CPU, a sector buffer 10 for data input/output, an ECC circuit 11, and a flash-memory control circuit 12. These components can be integrated into one IC. Interface circuit 6 is connected to host apparatus 2 through connector 3 and also connected to bus control circuit 7. Bus control circuit 7 is connected to CPU 8 for internal control, sector buffer 10, ECC circuit 11, and flash-memory control circuit 12. CPU 8 for internal control is connected to memory 9 for CPU.

When PC card 1 is connected to host apparatus 2, host apparatus 2 is connected to interface circuit 6 through connector 3. Connector 3 and interface circuit 6 constitute an interface section. Bus control circuit 7, CPU 8 for internal control, memory 9 for CPU, sector buffer 10, ECC circuit 11, and flash-memory control circuit 12 constitute a control section.

Interface circuit 6 transfers data between PC card 1 and host apparatus 2. Bus control circuit 7 controls the switching of internal buses to control the connections between interface circuit 6 and CPU 8 for internal control, sector buffer 10, ECC circuit 11, and flash-memory control circuit 12. CPU 8 for internal control performs signal control within PC card 1 to manage the operation of PC card 1. Memory 9 for CPU stores a logical/physical address conversion table that converts each logical sector address assigned by an instruction code of CPU 8 for internal control and by host apparatus 2 to a physical sector address of a nondefective sector in memory section 4.

ECC circuit 11 adds an error correcting code, called ECC hereafter, to the data input from host apparatus 2 and to be stored in memory section 4 to store the ECC-added data in memory section 4. ECC circuit 11 performs error correction processing for the data read out from memory section 4 by means of the ECC-added data. ECC circuit 11 then outputs the processed data into host apparatus 2 through bus control circuit 7, interface circuit 6, and connector 3. Flash-memory control circuit 12 outputs a control signal, such as an output-enable signal and a chip-enable signal, into memory section 4 to control it, depending on the read or write commands and address data concerning memory section 4 and issued from CPU 8 for internal control. For example, when a sector number is input from CPU 8 for internal control, flash-memory control circuit 12 generates address data corresponding to the input sector number to output into memory section 4.

When data is written in IC card 1, data transferred from host apparatus 2 in units of 512 B is first stored in sector buffer 10 and then written in memory section 4 by an instruction of CPU 8 for internal control. Also, when data is read out from IC card 1, data stored at the physical sector address corresponding to a logical address assigned by host apparatus 2 is first transferred from memory section 4 to sector buffer 10 and then transferred to host apparatus 2, in synchronization with a data-read signal issued from host apparatus 2. In this way, sector buffer 10 is used to temporarily store data during data transfer between host apparatus 2 and memory section 4.

The operation in PC card 1 is specified, for example, by PC card standards established by the Japan Electric Industry Development Association.

Memory section 4 is formed of 64 Mb flash memory of the AND type. Each sector of memory section 4 is 528 B consisting of a 512 B data area and a 16 B management area. A 64 Mb flash memory of the AND type has 16,384 sectors or 2,048 blocks, assuming one block is formed of 8 sectors. Incidentally, in this 64 Mb flash memory of the AND type, 16,384 logical sectors of 12 B can be installed, so that it is called a 64 Mb memory. However, it has the capacity of 16384 sectors of 528 B.

In this construction, an MGM is used for flash memory of memory section 4, so that up to 2% of 16384 sectors are allowed to be defective. In the flash memory used in memory section 4, a nondefectiveness code that indicates that a sector is nondefective is stored in the management area of that sector before shipping.

FIG. 2 illustrates the state of each sector in the memory section and the nondefectiveness code written in the management area. Referring to FIG. 2, the code "ABC" that indicates that a sector is nondefective is written in the management area of a usable sector by a test apparatus during the testing process of flash memory devices before shipping. The sectors in which the addresses of all the defective sectors in the memory device are listed are in the last physical block whose address is 2047. In these sectors is written the code "XYZ" that indicates that a sector is the nondefective sector in which the addresses of defective sectors are stored.

Figure 3:
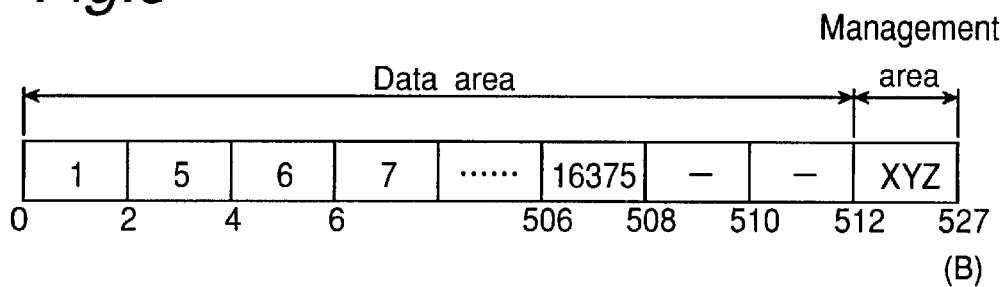
FIG. 3 illustrates an example of the data area and management area in a sector that stores the addresses of defective sectors.

As the nondefectiveness code "ABC", this address information about defective sectors and the code "XYZ' are written by a test apparatus during the testing process of flash memory devices before shipping. Flash memory used in memory section 4 is 64 Mb, so that the total number of physical sectors is 1,6384. Therefore, 2 B data can indicate all sector addresses. Therefore, as shown in FIG. 3, the 512 B data area of a sector in which the addresses of defective sectors are stored can hold a maximum of 256 addresses of defective sectors.

Flash memory used in memory section 4 is allowed to have up to memory 9 for CPU, to create a logical/physical address conversion table such that the physical sector address is equal to the logical sector address for each logical sector address from 0 to $A_1-1$. Next, CPU 8 for internal control obtains the second smallest sector address $A_2$ of the sector addresses of defective sectors stored in the volatile memory of memory 9 for CPU, to create a logical/physical address conversion table such that the physical sector address is equal to the logical sector address +1 for each logical sector address from $A_1$ to $A_2-2$.

Further, CPU 8 for internal control obtains the third smallest sector address $A_3$ of the sector addresses of defective sectors stored in the volatile memory of memory 9 for CPU, to create a logical/physical address conversion table such that the physical sector address is equal to the logical sector address +2 for each logical sector address from $A_2-1$ to $A_3-3$. Similarly, for every sector address $A_n$, where n is a positive integer and $A_n \leq 16,384$, of defective sectors stored in the volatile memory of memory 9 for CPU, CPU 8 for internal control creates a logical/physical address conversion table such that the physical sector address is equal to the logical sector address +n for each logical sector address from $A_n-(n-1)$ to $A_{n+1}-(n+1)$.

In this way, CPU 8 for internal control obtains the physical sector address corresponding to every logical sector address of the IC card and successively stores the physical sector address in a table in the order of logical sector addresses, to create a logical/physical address conversion table in the volatile memory of memory 9 for CPU. After that, CPU 8 for internal control 2% of defective sectors, that is, a maximum of 328 early-stage defective sectors, so that two sectors are sufficient for storing the addresses of defective sectors. Incidentally, in FIG. 2, all the sectors in the last block are assigned to store the addresses of defective sectors. By this means, errors of erasing address information about defective sectors in erasing ordinary sectors from address 0 to address 16375 can be prevented, and the addresses of defective sectors created by later stages can be additionally stored.

Next, the operation of creating the logical/physical conversion table during manufacturing PC card 1 is described in the following. Besides the volatile memory, Memory 9 for CPU has non-volatile memory and volatile memory for which data writing and data erasing cannot be electrically performed. After power is supplied to PC card 1 following the manufacturing of PC card, and after the operation of a predetermined initial resetting is performed, CPU 8 for internal control reads out all the addresses of defective sectors from the sectors in which the addresses of defective sectors are stored in memory section 4. Then CPU 8 for internal control stores these addresses in the volatile memory of memory 9 for CPU. Further, by using the addresses of defective sectors stored in the volatile memory of memory 9 for CPU, CPU 8 for internal control performs the operation of creating the logical/physical address conversion table to store the table in memory section 4 at predetermined addresses.

Figure 4:
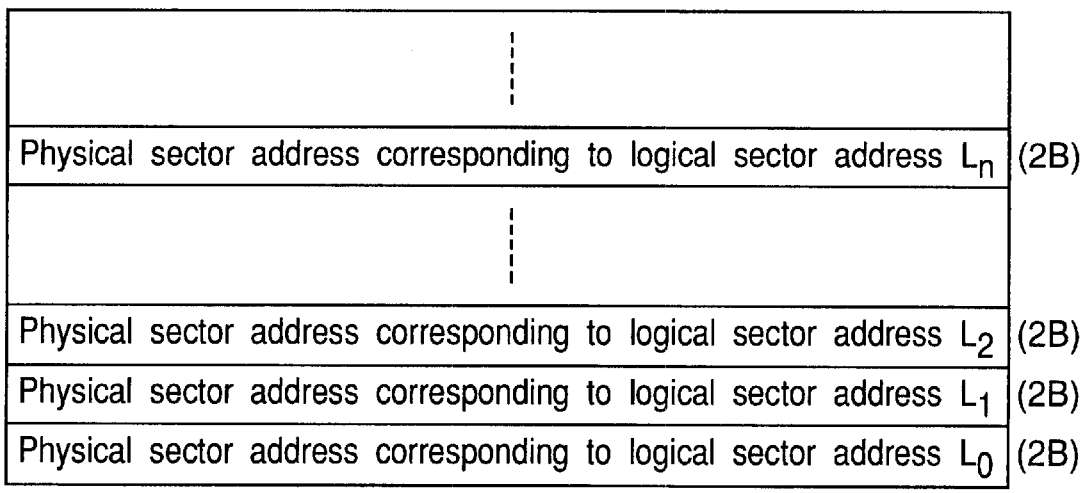
FIG. 4 illustrates an example of the logical/physical address conversion table.

FIG. 4 illustrates an example of the logical/physical address conversion table. The operation executed by CPU 8 for internal control for creating the logical/physical table is described in the following in conjunction with FIG. 4. CPU 8 for internal control obtains the smallest sector address $A_1$ of the sector addresses of defective sectors stored in the volatile memory of transfers the address conversion table in memory 9 for CPU to a predetermined area of memory section 4. After these procedures, each time the power of PC card 1 is reset, the address conversion table in memory 4 is loaded into the volatile memory of memory 9 for CPU, so that memory access can be obtained by referring to the address conversion table.

Figure 5:
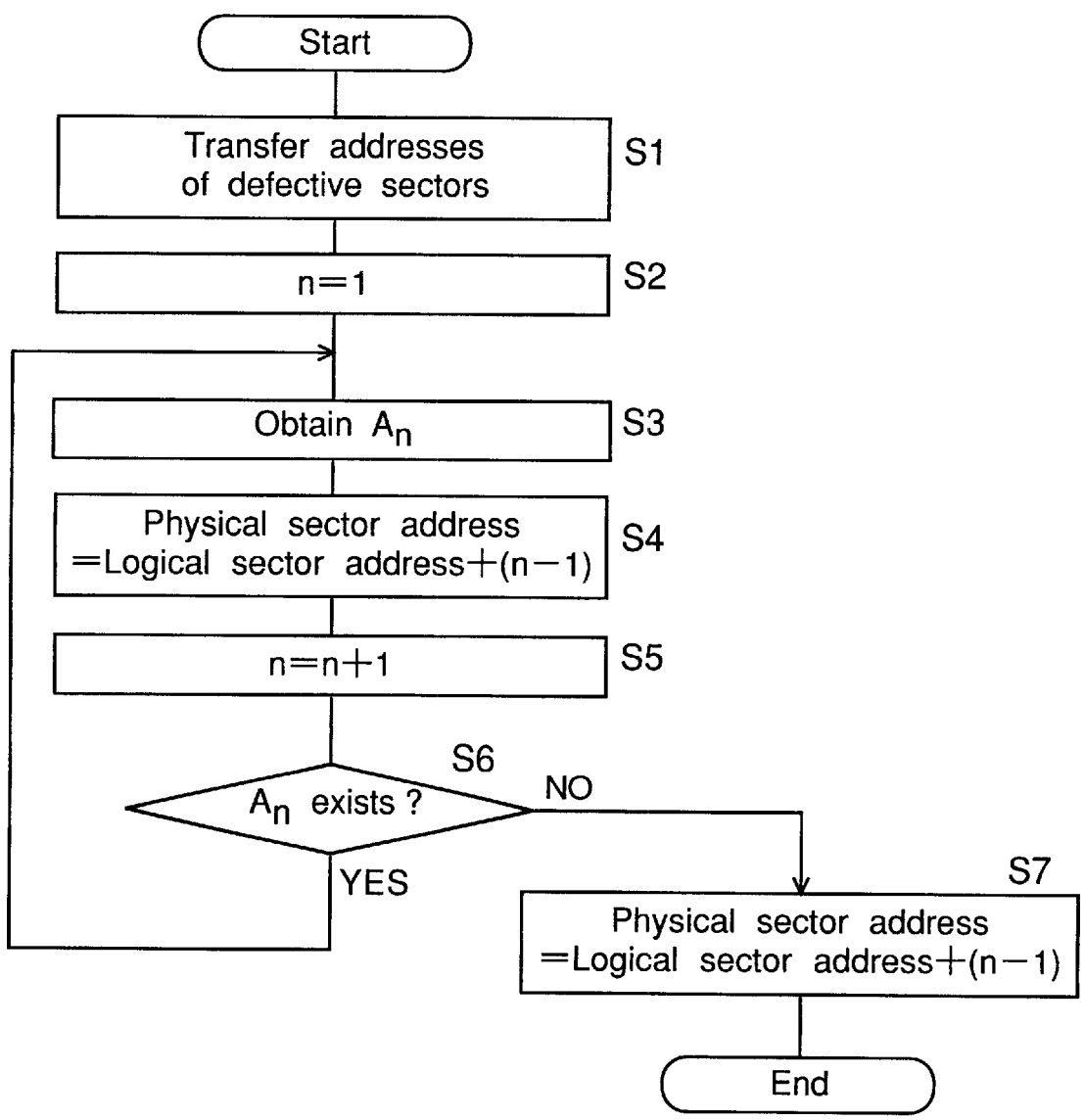
FIG. 5 is a flowchart illustrating the operation executed by a CPU for internal control for creating the logical/physical address conversion table.

FIG. 5 is a flowchart illustrating the operation executed by CPU 8 for internal control for creating the logical/physical address conversion table. The operation by CPU 8 for internal control for creating the logical/physical address conversion table is more detailed in the following in conjunction with FIG. 5. Referring to FIG. 5, the logical/physical address conversion table is created for 15,360 sectors of flash memory having a total of 16,384 sectors in memory section 4. In this case, the sectors whose physical sector addresses do not appear in the logical/physical address conversion table become reserved sectors for substitutes. The processing performed in each step of the flow is executed by CPU 8 for internal control, unless stated otherwise.

Referring to FIG. 5, in the first step S1, the sector addresses of defective sectors are read out from all sectors of memory section 4 in which the sector addresses of defective sectors are stored, and the sector addresses $A_1, A_2,$ . . . where $A_n < A_{n+1}$, are transferred to the volatile memory of memory 9 for CPU. Next, in step S2, the value of n is set as n=1, and in step S3, the sector address $A_n$ for the current value of n is obtained. In step S4, a logical/physical address conversion table such that the physical sector address is equal to the logical sector address+(n−1) for each logical sector address from $A_{n-1}-(n-2)$ to $A_n$−n is created, where $A_0 = -1$, so that from 0 to $A_1$−1 if n=1.

Then, in step S5, the value of n is incremented by 1. Next, in step S6, it is tested whether a sector address An of defective sectors exists or not. If there exists a sector address $A_n$ exists (YES), then the flow returns to step S3. If there exists no sector address $A_n$ (NO), then the flow goes to step S7. In step S7, a logical/physical address conversion table such that the physical sector address is equal to the logical sector address+(n−1) for each logical sector address from $A_{n-1}-(n-2)$ to 15359, and the flow is terminated.

In general, whether a physical sector address is usable or not can be tested by reading the management area of the physical sector address to check whether a nondefectiveness code is written therein or not. However, in the flash memory that is accessed in units of sectors, access time for reading the data area or management area of each sector, called first access time hereafter, is a large amount time that is several microseconds. Therefore, it takes a substantially large amount of time to create the logical/physical address conversion table for a PC card having a memory section of large memory size, if the management areas of the physical sector addresses corresponding to all the logical sector addresses are tested. For example, in the a 64 Mb flash memory of the AND type, if first access time is 5 μsec, then the mere total of first access time necessary for creating the logical/physical address conversion table becomes 5 μsec×16,384= 82 msec.

On the other hand, in the embodiment of the present invention, CPU 8 for internal control reads out address information about defective sectors stored in the sectors in which the sector addresses of all defective sectors in memory section 4 are stored, and stores the address information in the volatile memory of memory 9 for CPU. Access time for the volatile memory of memory 9 for CPU is usually only tens of nanoseconds or hundreds of nanoseconds. Therefore, CPU 8 for internal control can swiftly create the logical/physical address conversion table by referring to the address information stored in the volatile memory of memory 9 for CPU and by determining a usable physical sector address corresponding to each logical sector address.

For example, suppose that it takes 100 μsec for CPU 8 for internal control to read out address information about defective sectors from memory section 4 and suppose also that access time for memory 9 for CPU is 500 nsec. In this case, the time necessary for memory access to create the logical/physical address is 100 μsec+500 nsec×16,384=8.3 msec, which is 1/10 the time for a prior method.

In the embodiment of the present invention, the logical/physical address conversion table is created in the volatile memory of memory 9 for CPU. However, if the non-volatile memory of memory 9 for CPU is electrically writable and erasable as flash memory is, then the logical/physical address conversion table can be created in the non-volatile memory of memory 9 for CPU during the manufacturing process of PC card 1. In this case, it is unnecessary to load the logical/physical address conversion table into the volatile memory of memory 9 for CPU each time the power of PC card 1 is reset. Further, the logical/physical conversion table can be created at high speed during the manufacturing process of PC card 1, so that efficiency in manufacturing can be increased.

In the above embodiment of the present invention, the addresses of defective sectors have been stored in the last block of memory section 4. However, the addresses of defective sectors may be stored in the first block of memory section 4. They may also be successively stored in memory section 4 from the last sector backward or from the first sector forward.

As described above, in the semiconductor disk drive of the present embodiment, the addresses of all defective sectors are stored in a predetermined block or sectors of memory section 4 during manufacturing, and the logical/physical address conversion table is created based on the stored addresses of all defective sectors. Therefore, when the logical/physical address conversion table is created, access time for the flash memory of memory section 4 to obtain the addresses of defective sectors can be reduced, so that the logical/physical address conversion table can be created at high speed.

In order to increase the yield of flash memory used in the IC card, the addresses of defective sectors can be stored in the last or first nondefective block or sectors. In this case, a search operation that reads the management areas of sectors are required to reach the sectors in which the addresses of defective sectors are stored. However, after the addresses of defective sectors are read out, the logical/physical address conversion table can be created in the same way in the above embodiment.

In the above embodiment, the physical addresses of all defective sectors have been listed as address information about defective sectors. Alternatively, the defectiveness/nondefectiveness of all sectors in the flash memory can be represented by a bit sequence of a state map and stored in sectors. For example, if the bit 0 is assigned to a nondefective sector, and the bit 1 is assigned to a defective sector, then the nondefectiveness/defectiveness states of all the sectors of a 64 Mb flash memory of the AND type can be represented by a bit sequence of 16,384 b=2,048 B. Therefore, the bit sequence requires 4 sectors. Although the processing of creating the bit sequence becomes complex, the logical/physical address conversion table can be easily created based on the bit sequence of a state map.

Further, the physical address corresponding to the logical address may have an offset value to the physical head address of a disk although it is assumed to begin from the physical head address in the above embodiment of the present invention.

Although the present invention has been fully described in connection with the preferred embodiment thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor disk drive for use with an information processing apparatus comprising:

an interface section for interfacing with said information processing apparatus;

a memory section comprising a rewritable non-volatile memory consisting of MGM which allows initial stage defects at a predetermined ratio, said memory section having at least one sector in which address information about defective sectors is stored; and a control section for transferring data between said information processing apparatus and said memory section through said interface section and performing conversion from logical sector addresses to physical sector addresses of said memory section and memory management, said control section creating a logical/physical address conversion table based on said address information about defective sectors stored in said at least one sector.

2. The semiconductor disk drive according to claim 1, wherein a management code, indicative of said at least one sector storing said address information about defective sectors, has been written in a predetermined area of each of said at least one sector, and said control section reads out said address information about defective sectors from said at least one sector when indicated by said management code.

3. The semiconductor disk drive according to claim 1 wherein said address information about defective sectors is stored in a first or last block of said memory section.

4. The semiconductor disk drive according to claim 1 wherein said address information about defective sectors is stored in a first or last usable block of said memory section.

5. The semiconductor disk drive according to claim 1 wherein said address information about defective sectors is successively stored in sectors from a first address forward or last address backward.

6. The semiconductor disk drive according to claim 1 wherein said address information about defective sectors is successively stored from a first usable sector forward or last usable sector backward.

7. A method of creating a logical/physical address conversion table in a semiconductor disk drive having a memory section consisting of MGM which allows initial-stage defects at a predetermined ratio, said method comprising the steps of:

writing beforehand address information of defective sectors and a management code indicative of a sector wherein said address information has been written in at least one sector of said memory;

reading out said address information of defective sectors from said at least one sector in which said management code has been written; and creating a logical/physical conversion table based on said address information about defective sectors.

8. The method according to claim 7 wherein said at least one sector is a sector of a first or last block of said memory section.

9. The method according to claim 7 wherein said at least one sector is a sector of a first or last usable block of said memory section.

10. The method according to claim 7 wherein said address information about defective sectors is written successively from a first sector forward or last sector backward.

11. The method according to claim 7 wherein said address information about defective sectors is written successively from a fist usable sector forward or last usable sector backward.

\* \* \* \* \*